United States Patent
Teshima et al.

(10) Patent No.: US 10,057,992 B2
(45) Date of Patent: Aug. 21, 2018

(54) CERAMIC CIRCUIT SUBSTRATE AND ITS PRODUCTION METHOD

(71) Applicant: HITACHI METALS, LTD., Tokyo (JP)

(72) Inventors: Hiroyuki Teshima, Kitakyushu (JP); Hisayuki Imamura, Kitakyushu (JP); Junichi Watanabe, Kitakyushu (JP)

(73) Assignee: HITACHI METALS, LTD., Tokyo (JP)

( * ) Notice: Subject to any disclaimer, the term of this patent is extended or adjusted under 35 U.S.C. 154(b) by 605 days.

(21) Appl. No.: 14/422,477

(22) PCT Filed: Aug. 15, 2013

(86) PCT No.: PCT/JP2013/071978
§ 371 (c)(1),
(2) Date: Feb. 19, 2015

(87) PCT Pub. No.: WO2015/022748
PCT Pub. Date: Feb. 19, 2015

(65) Prior Publication Data
US 2015/0216056 A1    Jul. 30, 2015

(51) Int. Cl.
*B23K 31/02*    (2006.01)
*H05K 3/02*    (2006.01)
(Continued)

(52) U.S. Cl.
CPC ......... *H05K 3/022* (2013.01); *B23K 1/0016* (2013.01); *B23K 1/19* (2013.01); *C04B 37/026* (2013.01);
(Continued)

(58) Field of Classification Search
CPC ............ B23K 1/00–1/206; B23K 1/19; B23K 1/0016; H05K 3/022; H05K 2203/04;
(Continued)

(56) References Cited

U.S. PATENT DOCUMENTS

| 4,436,806 A | * | 3/1984 | Rendulic | G03F 7/0275 |
| | | | | 430/281.1 |
| 5,244,000 A | * | 9/1993 | Stanford | B23K 1/206 |
| | | | | 134/102.1 |

(Continued)

FOREIGN PATENT DOCUMENTS

| EP | 1298970 A2 | 4/2003 | | |
| GB | 1340441 A | * | 12/1973 | ............. H05K 3/428 |

(Continued)

OTHER PUBLICATIONS

Communication dated Jul. 2, 2015 from the European Patent Office in counterpart application No. 13882613.6.

(Continued)

*Primary Examiner* — Kiley Stoner
(74) *Attorney, Agent, or Firm* — Sughrue Mion, PLLC

(57) ABSTRACT

A method for producing a ceramic circuit substrate comprising the steps of forming brazing regions each comprising brazing material powder and an organic binder on a ceramic substrate; setting metal plates on the ceramic substrate via the brazing regions, and heating the ceramic substrate, the brazing regions and the metal plates to bond the metal plates to the ceramic substrate via brazing layers made of the brazing material, thereby forming a bonded body; and cleaning the bonded body with a hypochlorite-containing agent.

4 Claims, 6 Drawing Sheets

(51) Int. Cl.
*C23F 1/02* (2006.01)
*C23F 1/44* (2006.01)
*C23F 1/30* (2006.01)
*B23K 1/00* (2006.01)
*B23K 1/19* (2006.01)
*C04B 37/02* (2006.01)
*H05K 3/06* (2006.01)
*H05K 3/26* (2006.01)
*H05K 1/03* (2006.01)

(52) U.S. Cl.
CPC ............ *C23F 1/02* (2013.01); *C23F 1/30* (2013.01); *C23F 1/44* (2013.01); *C04B 2237/125* (2013.01); *C04B 2237/366* (2013.01); *C04B 2237/368* (2013.01); *C04B 2237/402* (2013.01); *C04B 2237/407* (2013.01); *C04B 2237/68* (2013.01); *C04B 2237/70* (2013.01); *H05K 1/0306* (2013.01); *H05K 3/06* (2013.01); *H05K 3/26* (2013.01); *H05K 2203/04* (2013.01); *H05K 2203/0766* (2013.01); *Y10T 428/12056* (2015.01)

(58) Field of Classification Search
CPC ......... H05K 2203/0766; H05K 1/0306; H05K 3/06; H05K 3/26; C04B 37/026; C04B 2237/125; C04B 2237/366; C04B 2237/68; C04B 2237/407; C04B 2237/70; C04B 2237/402; C04B 2237/368; C23F 1/30; C23F 1/44; C23F 1/02; Y10T 428/12056
USPC ............ 228/121–124.7, 245–262, 205–207, 228/223–224; 148/23–24
See application file for complete search history.

(56) References Cited

U.S. PATENT DOCUMENTS

| | | | |
|---|---|---|---|
| 5,354,415 A | 10/1994 | Fushii et al. | |
| 6,918,529 B2 | 7/2005 | Tsukaguchi et al. | |
| 6,952,871 B1* | 10/2005 | Cubero Pitel | H05K 3/06 29/825 |
| 7,312,160 B2 | 12/2007 | Aoki et al. | |
| 7,592,266 B2 | 9/2009 | Aoki et al. | |
| 2001/0030122 A1* | 10/2001 | Hara | B32B 27/34 204/192.14 |
| 2003/0066865 A1 | 4/2003 | Tsukaguchi et al. | |
| 2003/0092264 A1* | 5/2003 | Kajita | C23C 18/1619 438/689 |
| 2003/0139045 A1 | 7/2003 | Aoki et al. | |
| 2004/0022934 A1* | 2/2004 | Leung | H05K 3/244 427/97.2 |
| 2004/0069528 A1 | 4/2004 | Sakuraba et al. | |
| 2004/0173666 A1* | 9/2004 | Fukunaga | B01J 13/0043 228/202 |
| 2008/0066779 A1 | 3/2008 | Aoki et al. | |
| 2011/0147072 A1* | 6/2011 | Yamashita | C23F 1/02 174/268 |
| 2012/0045898 A1* | 2/2012 | Uozumi | C11D 3/3947 438/686 |
| 2013/0199830 A1* | 8/2013 | Morita | C08L 63/00 174/258 |
| 2013/0276284 A1* | 10/2013 | Brosseau | C22B 7/007 29/426.1 |
| 2014/0126155 A1 | 5/2014 | Imamura et al. | |
| 2014/0191019 A1* | 7/2014 | Chen | H05K 3/22 228/264 |

FOREIGN PATENT DOCUMENTS

| | | | | |
|---|---|---|---|---|
| JP | 59056972 A | * | 4/1984 | ............ B23K 1/20 |
| JP | 61037980 A | * | 2/1986 | ............ C23F 1/30 |
| JP | 4-170088 A | | 6/1992 | |
| JP | 5-198917 A | | 8/1993 | |
| JP | 2003-60111 A | | 2/2003 | |
| JP | 2003-110222 A | | 4/2003 | |
| JP | 2008-108957 A | | 5/2008 | |
| WO | 91/16805 A1 | | 10/1991 | |
| WO | 2013/002407 A1 | | 1/2013 | |

OTHER PUBLICATIONS

International Search Report of PCT/JP2013/071978, dated Nov. 12, 2013. [PCT/ISA/210].

\* cited by examiner

CERAMIC CIRCUIT SUBSTRATE AND ITS PRODUCTION METHOD

CROSS REFERENCE TO RELATED APPLICATIONS

This application is a National Stage of International Application No. PCT/JP2013/071978 filed Aug. 15, 2013, the contents of which are incorporated herein by reference in their entirety.

FIELD OF THE INVENTION

The present invention relates to a method for producing a ceramic circuit substrate comprising a ceramic substrate, brazing layers formed on the ceramic substrate, and metal plates bonded to the ceramic substrate via the brazing layers, and a ceramic circuit substrate having the structure.

BACKGROUND OF THE INVENTION

The production method of a ceramic circuit substrate, which may be called simply "circuit substrate" below, by brazing is disclosed, for example, in JP 2003-110222 A. The production method of a circuit substrate described in JP 2003-110222 A comprises bonding metal plates to at least one surface of a ceramic substrate via a brazing material; coating predetermined portions of the metal plates with a resist to etch unnecessary portions of the metal plates, thereby forming metal circuits; removing a residual brazing material and reaction products of the brazing material and the ceramic substrate while keeping the resist; and then removing the resist to form circuit patterns.

More specifically, the production method of a circuit substrate disclosed in JP 2003-110222 A comprises the steps of applying a brazing material paste comprising metal powder containing Ag, Cu, etc. in a predetermined composition, an organic binder and an organic solvent to both surfaces of the ceramic substrate by screen printing; setting Cu plates in contact with the brazing material; heating them at a predetermined temperature to bond the Cu plates to the ceramic substrate via the brazing material; coating predetermined portions of the metal plates with a UV-curing, alkali-soluble resist; removing unnecessary portions of the Cu plates with an etching solution comprising copper chloride, hydrogen peroxide water and hydrochloric acid to form metal circuits; immersing the product in a 30-% aqueous sodium thiosulfate solution while keeping the above resist; immersing the product in a brazing-material-removing liquid comprising EDTA and hydrogen peroxide water for a predetermined period of time to remove a residual brazing material and reaction products of the brazing material and the ceramic substrate; and then removing the resist.

As described above, in the production of a circuit substrate by a brazing method, a method comprising the steps of applying a brazing material paste comprising brazing material powder and an organic binder to a ceramic substrate, setting metal plates in contact with the brazing material paste to form a bonded body comprising the ceramic substrate, the brazing material paste and the metal plates, heating the bonded body at a brazing-material-melting temperature in vacuum or in non-oxidizing state to bond the metal plates to the ceramic substrate via the brazing material is widely used. The organic binder contained in the brazing material paste is decomposed and gasified in the heating process of the bonded body, so that it is removed from the brazing material paste. However, part of the gasified organic binder is likely deposited onto exposed surfaces of the ceramic substrate, which are not covered with the metal plates, forming carbon-based adhesive deposits. In the heating of the bonded body, deposits from a heating furnace atmosphere, etc. may also be formed on the bonded body.

Such deposits attached to the ceramic substrate surface are black or gray, evidently different from the color of the ceramic substrate, thereby being treated as defects in appearances. Also, because many of the deposits are highly conductive, sufficient electric insulation is unlikely secured between two metal plates constituting the metal circuit substrate, when large amounts of deposits are attached to the ceramic substrate surfaces exposed in a gap between the two metal plates, providing the circuit substrate with insulation resistance defects. It is extremely difficult to remove the insulation-resistance-decreasing deposits strongly attached to the ceramic substrate surface, by the etching solution or brazing-material-removing liquid disclosed in JP 2003-110222 A. When the ceramic circuit substrate is immersed in these solutions for a long period of time to remove the deposits completely, the resist and the metal plates are eroded, resulting in damaged metal plates. When the ceramic substrate is composed of a silicon nitride ceramic, the substrate tends to have large surface roughness due to the influence of columnar silicon nitride grains, making the removal of deposits further difficult.

OBJECT OF THE INVENTION

Accordingly, an object of the present invention is to provide a method for producing a ceramic circuit substrate with insulation-resistance-decreasing deposits removed or decreased on ceramic-substrate-exposed surfaces, and such a ceramic circuit substrate.

DISCLOSURE OF THE INVENTION

As a result of intensive research in view of the above object, it has been found that by brazing metal plates to a ceramic substrate via a brazing material, and cleaning the bonded body with a hypochlorite-containing agent, insulation-resistance-decreasing deposits derived from a brazing material paste, etc. are removed or decreased in a ceramic circuit substrate. The present invention has been completed based on such finding.

Thus, the method of the present invention for producing a ceramic circuit substrate comprises the steps of forming brazing regions each comprising brazing material powder and an organic binder on a ceramic substrate;

setting metal plates on the ceramic substrate via the brazing regions, and heating the ceramic substrate, the brazing regions and the metal plates to bond the metal plates to the ceramic substrate via brazing layers made of the brazing material, thereby forming a bonded body; and cleaning the bonded body with a hypochlorite-containing agent.

It is preferable that a resist layer is formed on the metal plates after the bonding step and before the cleaning step; that the metal plates are etched to form circuit patterns; and that residual brazing layers are then removed.

The concentration of hypochlorite in the agent is preferably 2.5-13.5% by mass as sodium hypochlorite. The agent preferably has pH of 9 or more.

The cleaning is preferably conducted at 30° C. or higher for 5 minutes or more.

The ceramic circuit substrate of the present invention comprises a ceramic substrate, two brazing layers formed on the ceramic substrate, and two metal plates each bonded to each of the two brazing layers; insulation resistance between the two metal plates being 500 MΩ/mm or more; and the area ratio of insulation-resistance-decreasing deposits on the ceramic substrate surfaces exposed in a gap between the two metal plates being 15% or less.

On the ceramic substrate surfaces exposed in a gap between the two metal plates, the density of deposits having the maximum diameter of 50 μm or more is preferably 50/mm$^2$ or less.

The ceramic substrate is preferably composed of a sintered nitride ceramic comprising a main phase of silicon-nitride-based or aluminum-nitride-based grains, and a grain boundary phase based on sintering aids between the grains, pores existing on ceramic substrate surfaces exposed in a gap between the two metal plates having the maximum diameter of 2-15 μm.

DESCRIPTION OF THE PREFERRED EMBODIMENTS

Figure 1A:
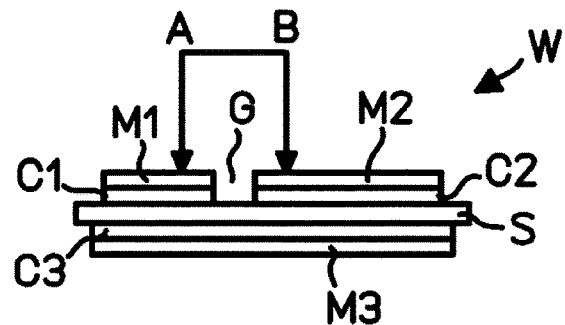
FIG. 1(a) is a front view schematically showing a ceramic circuit substrate.

[1] Production Method of Ceramic Circuit Substrate

The method of the present invention for producing a ceramic circuit substrate comprises the steps of (a) forming brazing regions each comprising brazing material powder and an organic binder on a ceramic substrate; (b) heating the ceramic substrate, the brazing regions, and metal plates placed on the ceramic substrate via the brazing regions, to bond the metal plates to the ceramic substrate via brazing layers made of the brazing material, thereby forming a bonded body; and (c) cleaning the bonded body with a hypochlorite-containing agent.

(a) Step of Forming Brazing Region

Brazing regions each comprising brazing material powder and an organic binder are formed on a ceramic substrate. The brazing material includes metal powder comprising Ag, Cu, etc. in a predetermined composition, and various organic resins may be used as the organic binder. The brazing regions may be formed by coating the ceramic substrate with a brazing material paste comprising brazing material powder and an organic binder by such a method as screen printing, etc.

When an acrylic resin is used as a binder in the brazing material paste, deposits formed by a gasified acrylic resin are likely formed on the ceramic substrate surface, in the heating process for bonding the metal plates to the ceramic substrate via the brazing material. Accordingly, when the acrylic resin is used as the binder, the method of the present invention exhibits more effects of removing or decreasing the deposits. The acrylic resin may be polyacrylate or polymethacrylate.

(b) Bonding Step

The ceramic substrate, the brazing regions comprising the brazing material powder and the organic binder, which are formed on the ceramic substrate, and the metal plates set via the brazing regions are heated to bond the metal plates to the ceramic substrate via the brazing layers. Heating is preferably conducted in vacuum or in a reducing atmosphere, with the temperature once kept at around a binder-decomposing temperature (for example, around 400° C.) to decompose and remove the organic component in the brazing material paste, and then kept at the brazing temperature for 10 minutes or more, in a temperature-ascending process. The brazing temperature is a temperature at which brazing layers can be properly formed, namely, a temperature equal to or higher than the melting point of the brazing material. The brazing temperature is usually the highest temperature in the temperature-ascending process.

A lower keeping temperature for decomposing and removing the binder tends to make carbon remain without being sufficiently removed. Accordingly, the keeping temperature for decomposing and removing the binder is preferably 300° C. or higher. For example, in the case of a binder including an acrylic resin, this keeping temperature is preferably 360° C. or higher. To prevent active metals in the brazing material from being oxidized by oxygen contained in the resin, etc. in the binder, the keeping temperature for decomposing and removing the binder is preferably 500° C. or lower, more preferably 480° C. or lower.

For example, an Ag—Cu-based brazing material having a melting point of 770-880° C. is preferably used as the brazing material at a brazing temperature of 770-880° C. The temperature of 770° C. or higher sufficiently melts the brazing material, preventing the formation of voids. It is more preferably 790° C. or higher. Excessive wetting with the brazing material does not spread at 880° C. or lower. The brazing temperature is more preferably 830-870° C. Though the brazing-temperature-keeping time depends on the amount charged into a heating furnace for bonding, it is preferably within 5 hours, more preferably within 2 hours, from the aspect of productivity. The brazing-temperature-keeping time may be properly set depending on the number of samples, and depending on the volume of a heating furnace for bonding and the displacement of a vacuum pump, for example, in the case of using a vacuum atmosphere. In order that the metal plates are bonded to the ceramic substrate without voids, heating is preferably conducted under load.

(c) Cleaning Step

In the bonding step, the organic binder contained in the decomposed brazing material may be deposited on part of the ceramic substrate surface, which is not covered with the metal plates, namely, on the exposed surfaces of the ceramic substrate. To remove deposits of this organic binder, cleaning is conducted with a hypochlorite-containing agent.

The hypochlorite may be preferably sodium hypochlorite, potassium hypochlorite, calcium hypochlorite, etc., more preferably sodium hypochlorite, calcium hypochlorite, or a mixture of sodium hypochlorite and calcium hypochlorite, particularly sodium hypochlorite.

The hypochlorite-containing agent is a solution of hypochlorite in water (pure water), in an organic solvent or in a mixture of water and an organic solvent. Instead of using hypochlorite, an aqueous hypochloric acid solution may be hydrolyzed with a base (sodium hydroxide, etc.) to have pH of 9 or more. A solution of hypochlorite in water (pure water) is usually used. The solution may contain an anticorrosion agent, a stabilizer, additives, a pH adjuster, etc., if necessary.

Because the effect of removing deposits is larger as the concentration of hypochlorite ions (ClO$^-$) in the agent is higher, hypochloric acid should be sufficiently hydrolyzed (dissociated). To this end, the pH of the agent is preferably 9-13, when an alkali salt such as hypochlorite of potassium, calcium, sodium, etc. is used. When the pH of the agent is less than 9, the hydrolysis of hypochloric acid is insufficient, resulting in a low concentration of hypochlorite ions (ClO$^-$), and low capacity of removing deposits formed on the ceramic substrate surface, thus consuming a lot of time. Though higher pH provides a more rapid removal reaction of deposits, the pH is preferably up to about 13 to achieve a stable, uniform reaction. Also, the pH of more than 13 is undesirable for handling because of extremely increased danger. Namely, the pH of the agent is more preferably 9.5-13, most preferably 10-13. For example, when sodium hypochlorite is used, its concentration may be adjusted to obtain pH of 9-13, but it is preferable to adjust the pH by adding an alkali such as sodium hydroxide, potassium hydroxide, ammonia water, etc. as a pH adjuster. A buffer may be used if necessary.

The concentration of hypochlorite such as potassium hypochlorite, calcium hypochlorite, sodium hypochlorite, etc. in the agent is preferably 2.5-13.5% by mass, more preferably 8-13% by mass, when calculated as sodium hypochlorite. "Concentration when calculated as sodium hypochlorite" means a concentration determined when a counter salt (K$^+$, Ca$^{2+}$, Na$^+$, etc.) of hypochlorite ions is substituted by sodium (Na$^+$) while keeping the same equivalent concentration. For example, 5% by mass of calcium hypochlorite [Ca(ClO)$_2$, molecular weight: 142.98, gram equivalent: 71.49] is equivalent to 5.42% by mass of sodium hypochlorite [NaClO, molecular weight: 77.44, gram equivalent: 77.44], by the calculation of 5% by mass×77.44/71.49=5.42% by mass.

To obtain a sufficient cleaning effect when hypochlorite is used, one or more of KOH, NH$_3$ and NaOH as a pH adjuster is preferably added to adjust the pH range. For example, in a diluted sodium hypochlorite solution (pH: 8-10), hypochloric acid exists mainly as dissociated OCl$^-$. On the other hand, in an aqueous hypochloric acid solution in a pH range including a strong acid range (pH≤2.7) and a mild acid range (pH: 5.0-6.5), hypochloric acid exists as undissociated HOCl in an extremely high percentage. To exhibit a high effect of cleaning carbonaceous deposits, etc. existing on the substrate surface, undissociated HOCl should be converted to dissociated OCl$^-$ by hydrolysis with a base.

When the agent adjusted as described above is used in the cleaning step, cleaning the bonded body at 30° C. or higher for 5 minutes or more is desirable to exhibit a higher effect of removing deposits from the ceramic substrate surface. When the cleaning temperature exceeds 60° C., sodium hypochlorite is decomposed to sodium chloride and sodium hydroxide, resulting in a shorter solution life. Further, the agent is made strongly alkaline, corroding not only the metal plates but also grain boundary phases exposed on the ceramic substrate surface. Accordingly, the cleaning temperature is preferably 60° C. or lower. From the aspect of suppressing the corrosion of the metal plates, the cleaning time is preferably 60 minutes or less.

Though not particularly restrictive, the organic solvent is preferably a water-soluble organic solvent, including alcohols such as methanol, ethanol, n-propanol, 2-propanol, n-butanol, sec-butanol, tert-butanol, etc.; diols such as ethylene glycol, propylene glycol, 1,3-propanediol, 1,2-butanediol, 2,3-butanediol, 1,3-butanediol, 1,4-butanediol, etc.; ether alcohols such as ethylene glycol monomethyl ether, ethylene glycol monoethyl ether, ethylene glycol monoisopropyl ether, ethylene glycol monobutyl ether, diethylene glycol monomethyl ether, diethylene glycol monoethyl ether, diethylene glycol monoisopropyl ether, diethylene glycol monobutyl ether, propylene glycol monomethyl ether, propylene glycol monoethyl ether, dipropylene glycol monomethyl ether, dipropylene glycol monoethyl ether, etc.; amides such as formamide, N-methylformamide, N,N-dimethylformamide, N,N-diethyl formamide, acetamide, N-methylacetamide, N,N-dimethylacetamide, N-methylpropionamide, 2-pyrrolidone, N-methylpyrrolidone, etc.; dimethyl sulfoxide; sulfolane; etc. They may be used alone or in combination.

The anticorrosion agent includes, for example, saccharides or sugar alcohols such as glucose, mannose, galactose, sorbitol, mannitol, xylitol, etc.; aromatic hydroxyl compounds such as phenol, cresol, catechol, resorcin, 2,3-pyridinediol, pyrogallol, salicylic acid, gallic acid, etc.; alkyne alcohols such as 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2-butyne-1,4-diol, etc.; triazoles such as benzotriazole, o-tolyltriazole, m-tolyltriazole, p-tolyltriazole, carboxy benzotriazole, 1-hydroxybenzotriazole, nitrobenzotriazole, dihydroxypropyl benzotriazole, etc. They may be used alone or in combination.

The additives include various surfactants, chelating agents, defoamers, etc. They may be added alone or in combination. The surfactants include, for example, polyoxyethylene lauryl ether, polyoxyethylene stearyl ether, monoethanolamine, triethanolamine, etc. The chelating agents include, for example, ethylenedimine, etc. The defoamers include, for example, polyoxyalkylene alkyl ether, polyoxyethylenealkylene ether, and silicone agents, etc.

(d) Other Steps

Before the bonding step and after the cleaning step, (d1) a step of forming a circuit patterns by forming resist layers on the metal plates in a pattern along a periphery of each brazing layer formed by the bonding step, and etching the metal plates, and (d2) a step of removing residual brazing layers after the formation of the circuit patterns are preferably conducted. After the circuit-pattern-forming step and the brazing-material-removing step, the above cleaning step can be conducted to remove deposits formed on the ceramic substrate in the circuit-pattern-forming step and/or the brazing-material-layer-removing step. Thus, a subsequent cleaning step enables the formation of the circuit patterns and the removal of the brazing material to be conducted under the optimum conditions without suffering the formation of deposits, thereby reducing damage in the resist layers and the metal plates in both steps. The resist layers are preferably formed in patterns along peripheries of the brazing layers formed in the bonding step.

For such reasons, the resist layers formed in the circuit-pattern-forming step can be as thin as 10-80 µm, preferably 30-70 µm.

The resist layers are preferably made of an ultraviolet-curable resist agent. The ultraviolet-curable resist agent includes copolymeric acrylate oligomers, acrylate monomers, fillers, photopolymerization initiators, color-adjusting agents, and defoaming/leveling agents. A copolymeric acrylate oligomer, a main component of the ultraviolet-curable resist agent, is a high-viscosity polymer hardenable by a condensation polymerization reaction. The copolymeric acrylate oligomer as a main component includes epoxy acrylates, urethane acrylates, polyester acrylates, polyether acrylates, and other copolymers. Acrylate monomers include isoamyl acrylate, lauryl acrylate, stearyl acrylate, ethoxydiethylene glycol acrylate, 2-hydroxyethyl acrylate, phenoxyethyl acrylate, etc.

The ultraviolet-curable resist agent is polymerized with an acrylate monomer by a radical reaction using a photopolymerization initiator, and its chemical resistance to an etching solution and a brazing-material-removing liquid can be improved by the degree of polymerization of the resultant copolymeric acrylate oligomer. The acrylate monomer constitutes a skeleton of the cured resist layer, providing the resist layer with improved flexibility and high adhesion to a circuit substrate. In a paste-like ultraviolet-curable resist agent before curing, the acrylate monomer functions as a viscosity-adjusting agent for providing fluidity.

For example, when a liquid agent comprising hydrogen peroxide and acidic ammonium fluoride is used as a brazing-material-removing liquid, a brazing-material-removing liquid comprising 10-40% by mass of hydrogen peroxide and 1-8% by mass of acidic ammonium fluoride can be used. Less than 10% by mass of hydrogen peroxide provides insufficient capability of removing the brazing material, and more than 40% by mass of hydrogen peroxide excessively corrodes the metal plates, resulting in poor dimensional precision of the metal plates. Less than 1% by mass of acidic ammonium fluoride provides a reduced capability of removing a reaction layer containing active metals, which is formed in a bonding interface between the brazing layers and the ceramic substrate. On the other hand, more than 8% by mass of acidic ammonium fluoride dissolves crystal grains in the ceramic substrate, deteriorating electric insulation and strength required for the ceramic substrate.

A step of forming plating layers of Ni, Au, etc. on the metal plates may be further conducted. For example, Ni plating layers as thick as about 5 µm can be formed on the metal plates, by immersing the metal plates in an electroless plating solution (85° C.) comprising nickel (Ni) as a main component and phosphorus (P) in a concentration adjusted to 8% by mass, for 20-30 minutes. Before the plating step, a chemical grinding step of the metal plates may be conducted, if necessary.

[2] Ceramic Circuit Substrate (1) Structure

The circuit substrate of the present invention is a ceramic circuit substrate comprising a ceramic substrate, two brazing layers formed with a gap therebetween on the ceramic substrate, and two metal plates bonded to the ceramic substrate via the two brazing layers, insulation resistance between the two metal plates being 500 MΩ/mm or more. The number of the brazing layers and the number of the bonded metal plates are not restricted to 2, but may be 3 or more. In that case, three or more metal plates may be bonded. With insulation resistance of 500 MΩ/mm or more between the two metal plates in a ceramic circuit substrate comprising semiconductor devices mounted on the two metal plates, even excessive current does not break insulation between the two metal plates, so that it does not flow through the semiconductor devices. The ceramic circuit substrate of the present invention is preferably produced by the above method of the present invention.

The ceramic circuit substrate having as high insulation resistance as described above can be produced, for example, by limiting the area ratio of deposits on the ceramic substrate surfaces exposed in a gap between the two metal plates to preferably 15% or less, more preferably 10% or less. Further, high-conductive deposits on the ceramic substrate surfaces exposed in a gap between the two metal plates tend to be networked to cause insulation breakdown. The networking of the deposits can be suppressed by limiting the density of deposits having the maximum diameter of 50 µm or more to 50/mm$^2$ or less.

When the ceramic substrate is a sintered nitride ceramic comprising a main phase of silicon-nitride-based grains or aluminum-nitride-based grains, and a grain boundary phase based on sintering aids between the grains, the maximum diameter of pores in the ceramic substrate in the gap is preferably 2-15 µm. When the maximum diameter of the pores is less than 2 µm, the deposits may not be sufficiently removed by the agent in the cleaning step. On the other hand, when the maximum diameter of the pores is more than 15 µm, the ceramic substrate has low strength, so that the ceramic circuit substrate is less reliable, for example, in the cooling cycle.

Figure 1B:
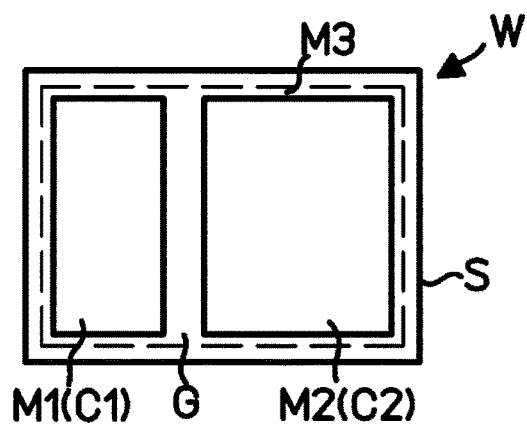
FIG. 1(b) is a plan view of FIG. 1(a).

FIGS. 1(a) and 1(b) are respectively a front view and an upper plan view showing an example of the ceramic circuit substrates of the present invention. The ceramic circuit substrate W is basically constituted by a ceramic substrate S; two brazing layers C1, C2 formed via a gap G on an upper surface (one surface) of the ceramic substrate S, which may be called "first brazing layer C1" and "second brazing layer C2" below; and two metal plates M1, M2 each bonded to an upper surface of the ceramic substrate S via each of the two brazing layers C1, C2, and acting as a circuit substrate on which semiconductor devices, etc. are mounted, which may be called "first metal plate M1" and "second metal plate M2" below. Each of the two metal plates M1, M2 is provided with a plating layer of Ni, Au, etc. The ceramic circuit substrate W shown in FIGS. 1(a) and 1(b) comprises a metal plate M3 bonded to a lower surface (the other surface) of the ceramic substrate S via a brazing layer C3 to act as a heat-dissipating plate.

(2) Ceramic Substrate

In the present invention characterized by removing deposits from the exposed surfaces of the ceramic substrate S, materials for the ceramic substrate S used in the ceramic circuit substrate W are not particularly restricted, but may be basically a sintered body of electrically insulating materials. However, because semiconductor devices mounted on the ceramic circuit substrate W have recently become higher in operation frequencies, generating larger heat, the ceramic substrate S is preferably made of nitride ceramics having high thermal conductivity. Specifically, the ceramic substrate S is preferably made of sintered aluminum nitride comprising a main phase of aluminum-nitride-based grains and a grain boundary phase based on sintering aids between the grains, or sintered silicon nitride comprising a main phase of silicon-nitride-based grains and a grain boundary phase based on sintering aids between the grains. More preferably, the ceramic substrate S is made of sintered silicon nitride having excellent mechanical strength and fracture toughness.

Because the ceramic substrate S of sintered silicon nitride tends to have larger surface roughness due to the influence of columnar grains, in a heating process, in which the ceramic substrate is bonded to the metal plates via a brazing material paste comprising brazing material powder and an organic binder, deposits of a gasified organic binder are likely formed on the rough ceramic surfaces. Accordingly, in the case of using a ceramic substrate S of sintered silicon nitride, the method of the present invention for producing a ceramic circuit substrate exhibits high effects of removing or decreasing the deposits.

When the ceramic substrate S is made of sintered silicon nitride, for example, starting material powder comprising 90-97% by mass of silicon nitride, and 3-10% by mass of a sintering aid including Mg and Y (and other rare earth elements) is mixed with proper amounts of an organic binder, a plasticizer, a dispersant and an organic solvent by ball milling, etc. to form slurry, and this slurry is formed into a thin ceramic green sheet by a doctor blade method or a calendar roll method. The ceramic green sheet is punched or cut to a desired shape, and sintered at a temperature of 1700-1900° C. to obtain the ceramic substrate S.

(3) Metal Plates

Materials for the metal plates M1-M3 constituting the ceramic circuit substrate W are not particularly restricted, as long as they can be bonded by a brazing material and have a higher melting point than that of the brazing material. The metal plates can be made of, for example, copper or its alloys, aluminum or its alloys, silver or its alloys, nickel or its alloys, nickel-plated molybdenum, nickel-plated tungsten, or nickel-plated iron alloys. Among them, copper or copper-containing alloys are most preferable from the aspect of electric resistance and elongation, as well as for high thermal conductivity (low thermal resistance), low migration, etc. Aluminum or aluminum-containing alloys are preferable in mounting reliability due to plastic deformation in a heating/cooling cycle, despite higher electric resistance and lower thermal conductivity (higher thermal resistance) than those of copper.

(4) Brazing Layers

Materials for the brazing layers C1-C3 bonding the metal plates M1-M3 to the ceramic substrate S are not particularly restricted, but may be preferably an Ag—Cu-based active brazing material comprising a main phase having a eutectic composition of Ag and Cu for exhibiting high strength, high sealability, etc., and an active metal of Ti, Zr, Hf, etc. From the aspect of bonding strength of the metal plates M1-M3 to the ceramic substrate S, an Ag—Cu—In-based, active brazing material, a ternary system obtained by adding In to the Ag—Cu-based, active brazing material, is more preferable. The bonding of the metal plates to the ceramic substrate S is conducted, as described above, by using a brazing material paste comprising powders of the brazing material components and an organic binder.

The present invention will be explained in further detail by Examples below, without intention of restricting the present invention thereto.

(1) Production of Ceramic Circuit Substrate

Example 1

As shown in FIGS. 1(a) and 1(b), a ceramic circuit substrate W comprising a ceramic substrate S; two brazing layers C1, C2 formed on an upper surface (one surface) of the ceramic substrate S via a gap Q, which may be called "first brazing layer C1" and "second brazing layers C2" below; two metal plates M1, M2 each bonded to an upper surface of the ceramic substrate S via each brazing layer C1, C2, which may be called "first metal plate M1" and "second metal plate M2" below; a Ni plating layer formed on each metal plate M1, M2; and a metal plate M3 bonded to a lower surface (the other surface) of the ceramic substrate S via a brazing layer C3 was produced by the method described below.

A ceramic substrate S of 30 mm and 40 mm in vertical and horizontal directions, and 0.32 mm in thickness in FIG. 1(b) was made of silicon nitride comprising 93% by mass of $Si_3N_4$, 4% by mass of Mg as converted to the amount of its oxide, and 3% by mass of Y as converted to the amount of its oxide, the total amount of the starting material powders being 100 parts by mass.

Each step in the production method of the ceramic circuit substrate S will be explained below referring to FIGS. 2(a) to 2(f), each of which is a plan view showing each step. Because the metal plates M1, M2 as circuit substrates and the metal plate M3 as a heat-dissipating plate were formed by basically the same steps in the production steps of the ceramic circuit substrate S described below, detailed explanation will be made only on the metal plates M1, M2, and the explanation of the metal plate M3 will be omitted.

Figure 2A:
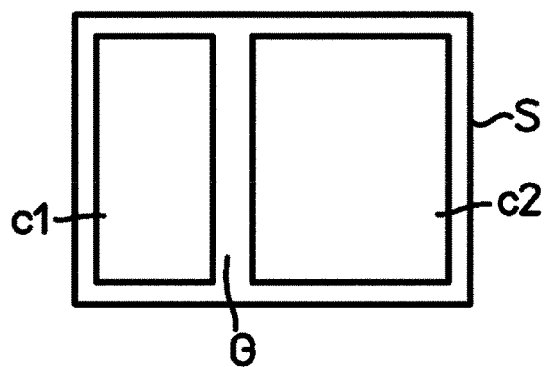
FIG. 2(a) is a first plan view for explaining a method for producing the ceramic circuit substrate of FIG. 1(a).

Step of Forming Brazing Regions 100 parts by mass of a brazing material powder comprising 70.6% by mass of Ag, 2.9% by mass of In, and 1.9% by mass of Ti, the balance being Cu and residual amounts of impurities was mixed with 5.3 parts by mass of polyacrylate as an organic binder, 19.1 parts by mass of α-terpineol as an organic solvent, 0.5 parts by mass in total of polyoxyalkylene alkyl ether and alkyl benzenesulfonate as a dispersant, to prepare a brazing material paste. As shown in FIG. 2(a), two brazing regions c1, c2 both as thick as 40 μm were formed by the above brazing material paste on an upper surface (one surface) of the ceramic substrate S with a gap G in a planar direction by a screen printing method. In FIG. 2(a), the first brazing region c1 had a size of 27.6 mm and 11.6 mm in vertical and horizontal directions, and the second brazing region c2 had a size of 27.6 mm and 23.6 mm in vertical and horizontal directions, with a gap G of 1.0 mm between the brazing regions c1, c2.

Bonding Step

Figure 2B:
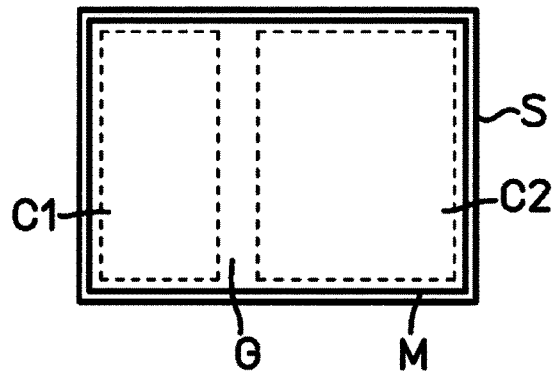
FIG. 2(b) is a second plan view for explaining the method for producing the ceramic circuit substrate of FIG. 1(a).

After the formation of the brazing regions, the brazing regions c1, c2 were covered with a metal plate M as thick as 0.5 mm, which was made of oxygen-free copper C1020H (JIS H3100), in the bonding step shown in FIG. 2(b). A combination of the ceramic substrate S, the brazing regions c1, c2 and the metal plate M was heated in vacuum in a heating furnace, to bond the metal plate M to the ceramic substrate S via the brazing layers C1, C2, thereby providing the bonded body. Taking into consideration the thermal expansion of the metal plate M in the bonding step, the metal plate M used had a size of 29.5 mm and 39.5 mm in vertical and horizontal directions in FIG. 2(b), smaller than the ceramic substrate S.

Figure 4:
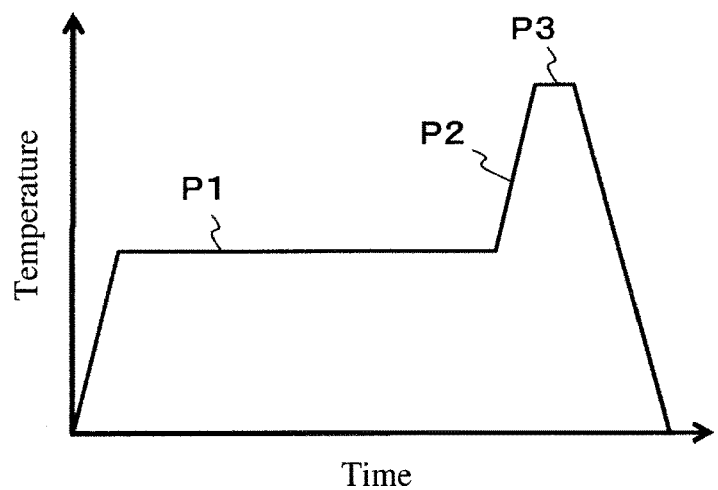
FIG. 4 is a graph showing a temperature profile in the bonding step.

The heating of the bonded body was conducted by a temperature pattern shown in FIG. 4, which comprised a first temperature-keeping step P1 for keeping the bonded body at 400° C., the decomposition temperature of an acrylic resin as an organic binder, for 10 hours, and a second temperature-keeping step P3 for keeping the bonded body at 765° C., the melting point of the brazing material, for 1 hour, the second temperature-keeping step P3 being conducted after a temperature-ascending step P2 for heating the bonded body at a constant temperature-ascending speed after the first temperature-keeping step P1.

Step of Forming Circuit Patterns

Figure 2C:
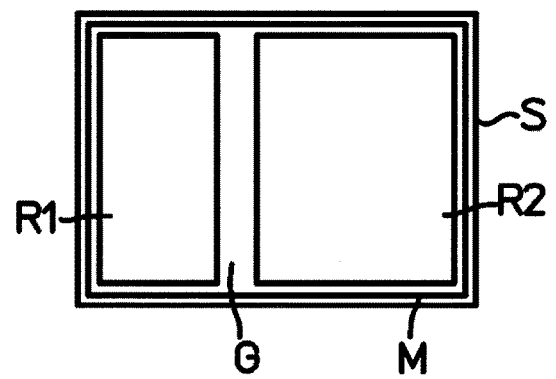
FIG. 2(c) is a third plan view for explaining the method for producing the ceramic circuit substrate of FIG. 1(a).
Figure 2D:
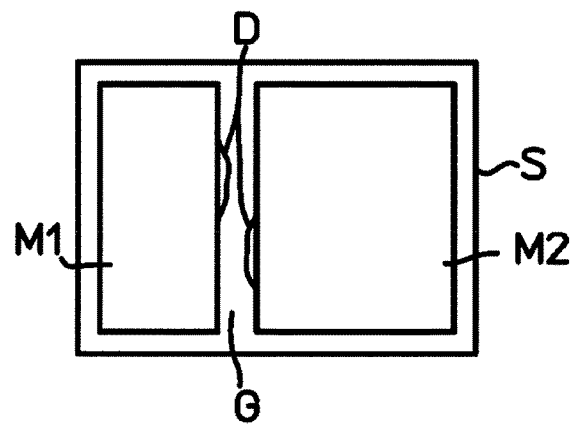
FIG. 2(d) is a fourth plan view for explaining the method for producing the ceramic circuit substrate of FIG. 1(a).

After the bonding step, two resist layers R1, R2 were formed in desired patterns on the metal plate M constituting the bonded body as shown in FIG. 2(c), and then etched to remove unnecessary portions of the metal plate M, thereby forming two metal plates M1, M2, circuit patterns arranged with a gap G in a planar direction as shown in FIG. 2(d). Specifically, an ultraviolet-curable etching resist was formed in patterns corresponding to the first and second metal plates M1, M2 on the metal plate M by a screen printing method, and the resultant bonded body was immersed in an etching solution [ferric chloride ($FeCl_3$) solution (46.5 Be)] at 50° C., to form metal plates M1, M2. In FIG. 2(d), the first metal plate M1 had a size of 28 mm and 12 mm, and the second metal plate M2 had a size of 28 mm and 24 mm, both in vertical and horizontal directions.

Step of Removing Brazing Layer

As shown in FIG. 2(d), after the resist layers were removed from the metal plates M1, M2, residual brazing material layers D flowing out from peripheries of the metal plates M1, M2 were removed by a brazing-material-removing liquid comprising 26% by mass of hydrogen peroxide and acidic ammonium fluoride at 40° C. for 40 minutes. The circuit-pattern-forming step and the brazing-material-removing step may be conducted after a cleaning step described below. However, to prevent the metal plates M1, M2 from being damaged, the circuit-pattern-forming step and the brazing-material-layer-removing step are conducted preferably between the bonding step and the cleaning step.

Cleaning Step

Figure 2E:
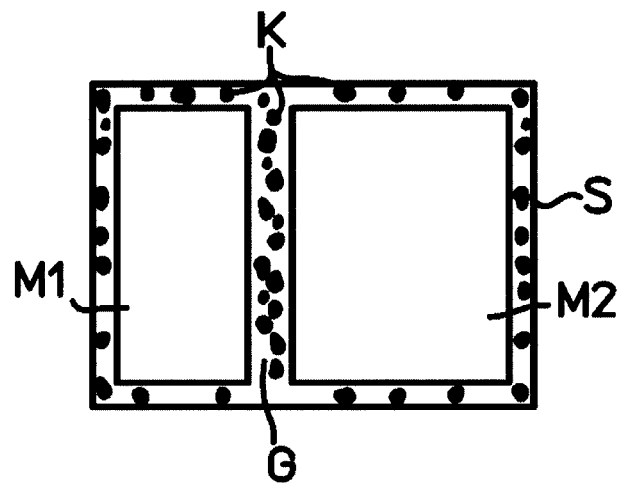
FIG. 2(e) is a fifth plan view for explaining the method for producing the ceramic circuit substrate of FIG. 1(a).
Figure 2F:
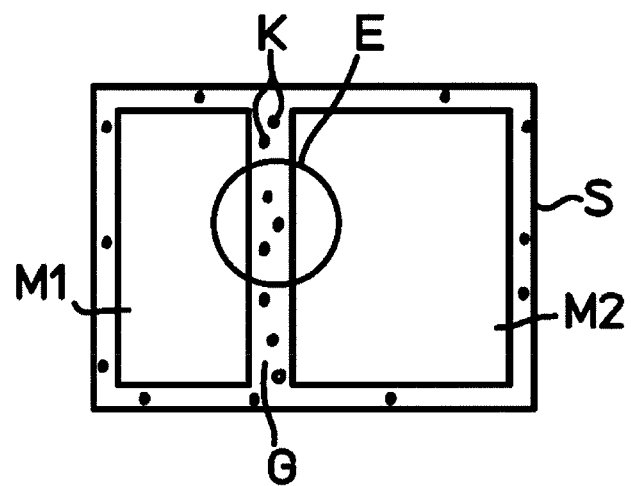
FIG. 2(f) is a sixth plan view for explaining the method for producing the ceramic circuit substrate of FIG. 1(a).

The brazing-material-layer-removing step provided a bonded body having deposits K formed on the exposed surfaces of the ceramic substrate S, for example, as shown in FIG. 2(e). Analysis indicated that most of the deposits K were carbonaceous. This bonded body was cleaned with an aqueous sodium hypochlorite solution having the concentration and pH shown in Table 1, under the temperature and time conditions shown in Table 1. As a result, as shown in FIG. 2(f), most of the deposits K attached to the exposed surfaces of the ceramic substrate S were removed, resulting in a ceramic circuit substrate W with the deposits K remaining slightly. The sodium hypochlorite-containing agent used in the cleaning step was obtained by diluting an aqueous sodium hypochlorite solution having a concentration of 14.0% by mass, which was used in Example 16, with pure water, without particularly adjusting its pH.

Ni Plating Step

The bonded body after the cleaning step was immersed in an electroless plating solution (85° C.) comprising nickel (Ni) as a main component and containing phosphorus (P) in a concentration of 8% by mass for 20-30 minutes, to form a Ni plating layer as thick as 5 μm on the metal (copper) substrates, thereby obtaining a ceramic circuit substrate.

Examples 2-30

A ceramic circuit substrate was produced in the same manner as in Example 1, except for changing the cleaning agent, and the cleaning temperature and time as shown in Table 1.

Comparative Examples 1 and 2

In Comparative Example 1, a ceramic circuit substrate was produced in the same manner as in Example 1 except for omitting the cleaning step. In Comparative Example 2, a ceramic circuit substrate was produced in the same manner as in Example 1, except for using an aqueous solution comprising 3% by mass of hydrogen peroxide and 12% by mass of sulfuric acid as a cleaning agent in place of the aqueous sodium hypochlorite solution, with the cleaning temperature and time shown in Table 1.

TABLE 1

| | Cleaning Step | | | | |
|---|---|---|---|---|---|
| | Agent | | | | |
| No. | Component | Concentration (% by mass) | pH | Temperature (° C.) | Time (minutes) |
| Example 1 | Sodium Hypochlorite | 2.0 | 9.2 | 30 | 10 |
| Example 2 | Sodium Hypochlorite | 2.5 | 9.5 | 30 | 10 |
| Example 3 | Sodium Hypochlorite | 3.0 | 9.8 | 30 | 10 |
| Example 4 | Sodium Hypochlorite | 5.0 | 10.4 | 30 | 10 |
| Example 5 | Sodium Hypochlorite | 7.0 | 10.9 | 30 | 10 |
| Example 6 | Sodium Hypochlorite | 8.0 | 11.2 | 30 | 10 |
| Example 7 | Sodium Hypochlorite | 9.0 | 11.5 | 30 | 10 |
| Example 8 | Sodium Hypochlorite | 10.0 | 11.8 | 30 | 10 |
| Example 9 | Sodium Hypochlorite | 12.0 | 12.3 | 30 | 10 |
| Example 10 | Sodium Hypochlorite | 13.0 | 12.9 | 40 | 40 |
| Example 11 | Sodium Hypochlorite | 13.0 | 12.9 | 45 | 50 |
| Example 12 | Sodium Hypochlorite | 13.0 | 12.9 | 50 | 60 |
| Example 13 | Sodium Hypochlorite | 13.0 | 12.9 | 60 | 70 |
| Example 14 | Sodium Hypochlorite | 13.0 | 12.9 | 30 | 10 |
| Example 15 | Sodium Hypochlorite | 13.5 | 13.1 | 30 | 10 |
| Example 16 | Sodium Hypochlorite | 14.0 | 13.2 | 30 | 10 |
| Example 17 | Sodium Hypochlorite | 3.0 | 9.8 | 35 | 10 |
| Example 18 | Sodium Hypochlorite | 3.0 | 9.8 | 40 | 10 |
| Example 19 | Sodium Hypochlorite | 3.0 | 9.8 | 50 | 10 |
| Example 20 | Sodium Hypochlorite | 3.0 | 9.8 | 55 | 10 |
| Example 21 | Sodium Hypochlorite | 3.0 | 9.8 | 57 | 10 |
| Example 22 | Sodium Hypochlorite | 5.0 | 10.4 | 35 | 10 |
| Example 23 | Sodium Hypochlorite | 12.5 | 12.5 | 55 | 10 |
| Example 24 | Sodium Hypochlorite | 3.0 | 9.8 | 30 | 20 |
| Example 25 | Sodium Hypochlorite | 3.0 | 9.8 | 30 | 30 |
| Example 26 | Sodium Hypochlorite | 3.0 | 9.8 | 30 | 40 |
| Example 27 | Sodium Hypochlorite | 3.0 | 9.8 | 30 | 50 |
| Example 28 | Sodium Hypochlorite | 5.0 | 10.4 | 30 | 20 |
| Example 29 | Sodium Hypochlorite | 12.5 | 12.5 | 30 | 40 |
| Example 30 | Sodium Hypochlorite | 2.5 | 9.5 | 30 | 5 |
| Comparative Example 1 | No cleaning step | | | | |
| Comparative Example 2 | Hydrogen Peroxide + Sulfuric Acid | 15 | — | 50 | 20 |

(2) Evaluation of Ceramic Circuit Substrate

With respect to the ceramic circuit substrates of Examples and Comparative Examples, the area ratio of deposits K, insulation resistance (minimum value), insulation breakdown voltage, and average bending strength were measured as described below. The results are shown in Table 2.

(a) Area Ratio of Deposits K

Figure 2G:
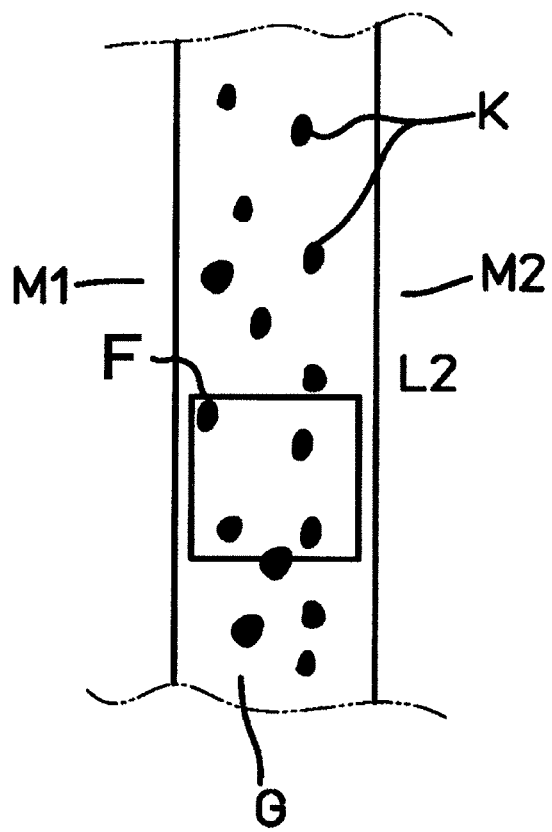
FIG. 2(g) is an enlarged view showing a portion E in FIG. 2(f).

With respect to each of 20 ceramic circuit substrates arbitrarily selected from 100 ceramic circuit substrates, an optical photomicrograph of an exposed surface of the ceramic substrate S in the gap G in FIG. 2(g) was taken, and binarized to identify the deposits K. Pluralities of square regions F of 0.8 mm×0.8 mm were set at arbitrary positions in each photomicrograph, and the area ratio of deposits K in each square region F was calculated, and averaged for all the square regions F. Using a mode method, a threshold value of binarization was determined by obtaining the concentration distributions of deposits K on the binarized black-and-white images of several ceramic circuit substrates, and averaging them.

Figure 3A:
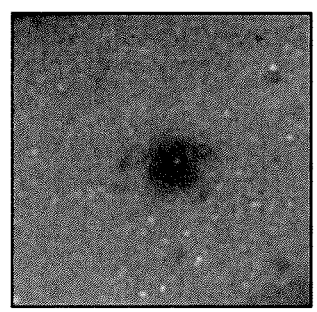
FIG. 3(a) is an optical photomicrograph showing a carbonaceous deposit existing in a gap in the circuit substrate.
Figure 3B:
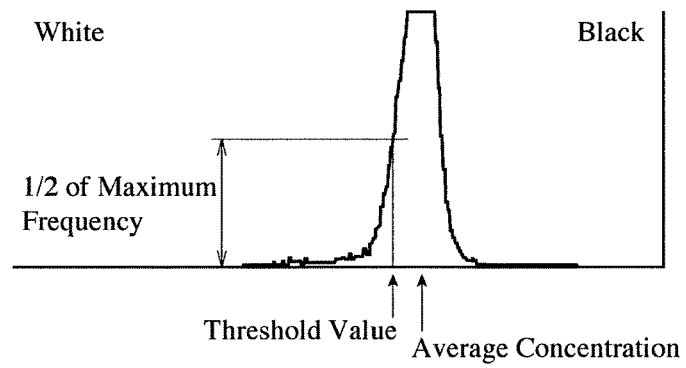
FIG. 3(b) is a graph (histogram) showing a black-and-white concentration distribution of carbonaceous deposits, which is determined from the image of FIG. 3(a).
Figure 3C:
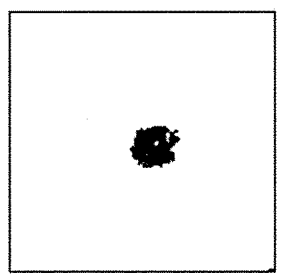
FIG. 3(c) is an image obtained by binarizing the image of FIG. 3(a) using one-half of the maximum concentration as a threshold value.

The method of determining a threshold value used for obtaining a monochromatic image of the deposits K will be explained in detail below referring to FIGS. 3(a) to 3(c). A portion including a deposit K was cut out of the optical photomicrograph [FIG. 3(a)], and a concentration therein was divided to 256 steps. The resultant concentration distribution was depicted in FIG. 3(b), in which the axis of abscissa indicates the concentration, and the axis of ordinate indicates a frequency. A concentration at the maximum frequency was an average concentration, and a concentration at a half of the maximum frequency was a threshold value, in this ceramic circuit substrate. Threshold values were similarly determined on other ceramic circuit substrates. The threshold values of all the ceramic circuit substrates were averaged to determine a threshold value for binarization. The image of a deposit K in FIG. 3(a) was binarized using this threshold value to obtain a binarized image shown in FIG. 3(c). It was confirmed by energy-dispersive X-ray spectrometer (UTW-type Si (Li) semiconductor detector with beam diameter of 1 nm available from Nolan Instruments Co., Ltd.) that black portions in FIG. 2(g) were carbonaceous deposits K.

(b) Insulation Resistance

With spherical electrodes A, B for an insulation resistance test disposed at arbitrary points of the first and second metal plates M1, M2 as shown in FIG. 1(a), DC voltage of 1000 V was applied between the first metal plate M1 and the second metal plate M2, and the resistance after 30 seconds was regarded as insulation resistance. The insulation resistance was the minimum resistance among those measured on 100 ceramic circuit substrates in each of Examples and Comparative Examples.

(c) Insulation Breakdown Voltage

The insulation breakdown voltage was measured by applying AC voltage between front and back surfaces of the ceramic circuit substrate. As shown in FIG. 1(a), electrically short-circuited spherical electrodes A and B were disposed on the first and second metal plates M1, M2, and an electrode C (not shown) was attached to the metal plate M3 on a back surface of the ceramic circuit substrate. This ceramic circuit substrate was set in an insulating silicone oil at room temperature, and alternating voltage of 0-10 kV gradually increasing at a speed of 0.1 kV/sec was applied between front and back surfaces of the circuit substrate in a withstand voltage tester (TOS5101 available from Kikusui Electronics Corporation), to measure, as insulation breakdown voltage, voltage at which current exceeding the upper limit of leak current flew. This measurement was conducted on five samples, and the resultant measured values were averaged.

(d) Average Bending Strength

The bending strength was measured on a test piece of 20 mm in length, 4 mm in width and 0.32 mm in thickness cut out of a ceramic substrate treated with a liquid agent, by a three-point-bending test (two-point interval=7 mm) at a crosshead speed of 0.5 mm/min using an autograph (AG-50KNG available from Shimadzu Corporation). The ceramic substrate for this test piece was obtained by producing a silicon nitride substrate with no circuit pattern, and subjecting the silicon nitride substrate to the same chemical treatment as that of the ceramic circuit substrate without copper bonding. Namely, by measuring the bending strength of the test piece, the strength variation of the silicon nitride substrate was measured. A sensor used was a load cell (SBL-1kN). The average bending strength was determined by averaging the values measured on 10 test pieces.

(e) Surface Insulation Breakdown

In the above insulation breakdown test (c), samples are subjected to two modes of insulation breakdown between front and back surfaces, penetration breakdown in which discharge occurs in the ceramic substrate, and surface breakdown in which discharge occurs on outer surfaces of the ceramic substrate. Surfaces of the ceramic substrate S extending from a front surface to a back surface are called simply "surfaces." Because conductive deposits, etc. on the surfaces cause insulation breakdown to occur easily, the surface insulation breakdown was evaluated.

TABLE 2

| No. | Area Ratio of Deposits (%) | Minimum Insulation Resistance ($1 \times 10^3$ MΩ/mm) | Insulation Breakdown Voltage (kV AC) | Average Bending Strength (MPa) |
|---|---|---|---|---|
| Example 1[1] | 0.82 | 2.8 | 7.7 | 776 |
| Example 2[1] | 0.77 | 3.2 | 7.9 | 772 |
| Example 3 | 0.55 | 8.8 | 8.1 | 788 |
| Example 4 | 0.42 | 13 | 7.8 | 769 |
| Example 5 | 0.33 | 25 | 8.0 | 789 |
| Example 6 | 0.31 | 32 | 8.5 | 774 |
| Example 7 | 0.24 | 57 | 8.8 | 780 |
| Example 8 | 0.18 | 88 | 8.6 | 771 |
| Example 9 | 0.13 | 110 | 8.7 | 761 |
| Example 10 | 0.05 | 540 | 8.8 | 775 |
| Example 11 | 0.04 | 650 | 8.9 | 782 |
| Example 12 | 0.03 | 725 | 8.9 | 769 |
| Example 13 | 0.02 | 784 | 9.3 | 773 |
| Example 14 | 0.08 | 180 | 9.0 | 790 |
| Example 15 | 0.05 | 210 | 8.8 | 784 |
| Example 16 | 0.04 | 250 | 8.9 | 785 |
| Example 17 | 0.47 | 9.9 | 7.9 | 791 |
| Example 18 | 0.41 | 13 | 7.7 | 783 |
| Example 19 | 0.39 | 15 | 8.1 | 767 |
| Example 20 | 0.37 | 19 | 8.4 | 781 |
| Example 21 | 0.34 | 24 | 8.3 | 792 |
| Example 22 | 0.37 | 17 | 8.1 | 785 |
| Example 23 | 0.04 | 260 | 9.2 | 773 |
| Example 24 | 0.26 | 62 | 8.7 | 769 |
| Example 25 | 0.16 | 97 | 8.6 | 784 |
| Example 26 | 0.11 | 140 | 8.6 | 771 |
| Example 27 | 0.07 | 190 | 8.9 | 764 |
| Example 28 | 0.22 | 76 | 8.2 | 794 |
| Example 29 | 0.01 | 320 | 8.7 | 782 |
| Example 30[1] | 5.00 | 1.2 | 8.1 | 780 |
| Comp. Ex. 1[2] | 17.6 | 0.4 | 6.2 | 775 |
| Comp. Ex. 2[3] | 0.17 | 92 | 4.9 | 659 |

Note
[1] Surface insulation breakdown occurred.
[2] Surface insulation breakdown much occurred.
[3] Glassy grain boundary phases eluted.

(3) Results

Figure 5A:
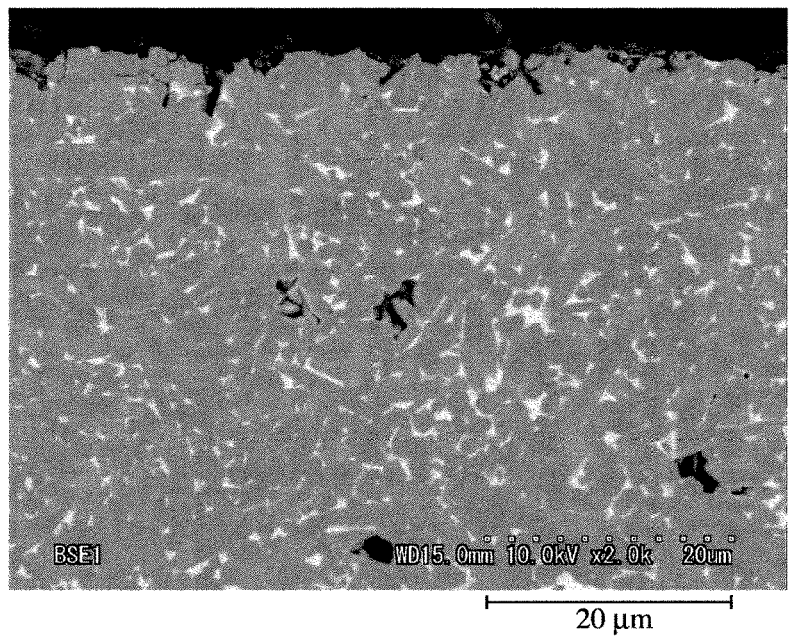
FIG. 5(a) is a photograph showing a cross section of the ceramic substrate of Example 9.
Figure 5B:
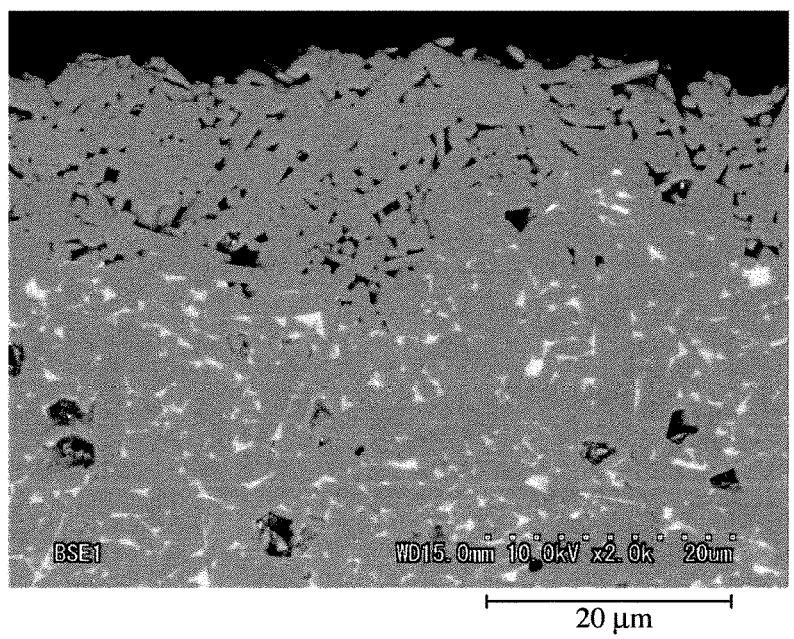
FIG. 5(b) is a photograph showing a cross section of the ceramic substrate of Comparative Example 2.

In each ceramic circuit substrate of Examples 1-30, the area ratio of deposits K on the ceramic substrate surfaces exposed in a gap G between two metal plates M1, M2 was 10% or less, with the minimum insulation resistance of 500 MΩ/mm or more between the metal plates M1, M2. On the other hand, in the ceramic circuit substrate of Comparative Example 1 produced without a cleaning step, the area ratio of deposits K was as large as 17.6%, the minimum insulation resistance was as extremely low as 0.4×10³ MΩ/mm, and the insulation breakdown voltage was as low as 6.2 kV. This appears to be due to the fact that the ceramic circuit substrate of Comparative Example 1 suffered large variations of measured insulation resistance and a large area ratio of deposits K. Further, breakdown much occurred on the surfaces. In the ceramic circuit substrate of Comparative Example 2 produced by using a mixed aqueous solution of hydrogen peroxide and sulfuric acid as a cleaning agent, the area ratio of deposits K was as low as 0.17%, and the minimum insulation resistance was as relatively high as 92×10³ MΩ/mm, but the insulation breakdown voltage was as extremely low as 4.9 kV. It is presumed from the comparison of the cross section photographs of the ceramic substrates of Example 9 and Comparative Example 2 [FIGS. 5(a) and 5(b)] that decrease in insulation breakdown voltage in Comparative Example 2 [FIG. 5(b)] was caused by the elution of glassy grain boundary phases (white portions in the figure) near the surface, providing pores (black portions in the figure) having a lower dielectric constant than that of glass. It was further found that the average bending strength was as low as 659 MPa, meaning the deterioration of the ceramic substrate.

The comparison of Examples 1-9 and 14-16, in which the concentration of a cleaning agent (aqueous sodium hypochlorite solution) varied from 2.0% by mass to 14.0% by mass (pH 9.2-13.2) with constant cleaning time and temperature, revealed that a higher concentration (pH) of the aqueous sodium hypochlorite solution provided a lower area ratio of deposits K, and a larger minimum insulation resistance. The ceramic circuit substrates of Examples 1 and 2 had area ratios of deposits K of 0.82% and 0.77%, respectively, slightly higher than those of Examples 3-9 and 14-16, with surface insulation breakdown observed. This appears to be due to the fact that the cleaning agent (aqueous sodium hypochlorite solution) had pH as relatively low as 9.2 and 9.5. On the other hand, in the ceramic circuit substrates of Example 15 using an aqueous sodium hypochlorite solution having pH of 13.1 and Example 16 using an aqueous sodium hypochlorite solution having pH of 13.2, the area ratios of deposits K were as long as 0.05% and 0.04%, and the minimum insulation resistances were as large as 210×10³ MΩ/mm and 250×10³ MΩ/mm. The cleaning step in Examples 1-30 did not damage the function as electrodes of the metal plates M1, M2 in each sample.

The comparison of Examples 3 and 17-21, in which only the treatment temperature varied from 30° C. to 57° C. without changing the agent and the cleaning time, revealed that a higher treatment temperature provided a lower area ratio of deposits K and a larger minimum insulation resistance.

The comparison of Examples 3 and 24-27, in which only the treatment time varied from 10 minutes to 50 minutes without changing the agent and the cleaning temperature, revealed that a longer treatment time provided a lower area ratio of deposits K and a larger minimum insulation resistance. For example, when the treatment time was changed to 20 minutes in Examples 1 and 2, insulation breakdown stopped occurring on the surfaces. However, when the treatment time was changed to 20 minutes in Comparative Example 2, glassy grain boundary phases were further eluted. Accordingly, when a mixed solution of hydrogen peroxide and sulfuric acid is used as a cleaning agent, a long treatment time is not preferable.

Effect of the Invention

Deposits derived from a brazing material paste, etc. are removed or decreased by cleaning the bonded body with a hypochlorite-containing agent, providing a ceramic circuit substrate having excellent electric insulation between metal plates with no appearance defects.

What is claimed is:

1. A method for producing a ceramic circuit substrate comprising the steps of:
    forming brazing regions each comprising brazing material powder and an organic binder on a ceramic substrate;
    setting metal plates on said ceramic substrate via said brazing regions, and heating said ceramic substrate, said brazing regions and said metal plates to bond said metal plates to said ceramic substrate via brazing layers made of said brazing material, thereby forming a bonded body; and
    removing deposits of organic binder by cleaning said bonded body with a hypochlorite-containing agent,
    wherein the method further comprises a step of forming a resist layer on said metal plates after the bonding step and before the cleaning step, a step of etching said metal plates to form circuit patterns, and then a step of removing residual brazing layers.

2. The method for producing a ceramic circuit substrate according to claim 1, wherein the concentration of hypochlorite is 2.5-13.5% by mass as sodium hypochlorite.

3. The method for producing a ceramic circuit substrate according to claim 1, wherein said agent has pH of 9 or more.

4. The method for producing a ceramic circuit substrate according to claim 1, wherein said cleaning is conducted at 30° C. or higher for 5 minutes or more.

* * * * *